United States Patent [19]
Fukumoto et al.

[11] 4,087,761
[45] May 2, 1978

[54] AUDIO POWER AMPLIFIER

[75] Inventors: Nobuo Fukumoto; Mitsugo Ohiwa; Teruyoshi Matsui; Hajime Ohta, all of Hamamatsu, Japan

[73] Assignee: Nippon Gakki Seizo Kabushiki Kaisha, Hamamatsu, Japan

[21] Appl. No.: 699,609

[22] Filed: Jun. 24, 1976

Related U.S. Application Data

[63] Continuation of Ser. No. 429,703, Jan. 2, 1974, abandoned.

[30] Foreign Application Priority Data

Dec. 30, 1972 Japan .................................... 48/2946

[51] Int. Cl.² ............................................ H03F 3/26
[52] U.S. Cl. .................... 330/267; 330/127; 330/263; 330/268
[58] Field of Search ................ 325/492; 330/127, 263, 330/267, 268

[56] References Cited

U.S. PATENT DOCUMENTS

| 2,259,121 | 10/1941 | Temple | 325/492 X |
| 2,963,656 | 12/1960 | Parris | 330/17 |
| 3,787,777 | 1/1974 | Mercola et al. | 330/15 |

Primary Examiner—Lawrence J. Dahl
Attorney, Agent, or Firm—Cushman, Darby & Cushman

[57] ABSTRACT

An audio power amplifier can be operated in either class A, class B or class AB amplifier modes by selectively switching bias values set in a bias setting circuitry provided for a driver stage which drives the main power amplifier stage.

46 Claims, 4 Drawing Figures

AUDIO POWER AMPLIFIER

This is a continuation of our copending application Ser. No. 429,703, filed Jan. 2, 1974, now abandoned.

BACKGROUND OF THE INVENTION

This invention relates to an audio power amplifier for stereophonic systems, which can be operated either in class A, class B or class AB amplifier operation mode, and in which the working power supply voltage can also be switched to levels convenient for the respective class A, class B and class AB operation modes.

The transistorized power amplifiers heretofore used for high fidelity amplifiers are mostly of the push-pull type, and their operation mode is usually either of class A amplifier, class B amplifier or class AB amplifier type.

Of the above amplifiers the class B power amplifier is highly efficient and permits obtaining a large output, so that this type of amplifier has been adopted for almost all transistorized power amplifiers. On the debit side, however, it is prone to crossover distortions, deteriorating the quality of sound produced.

On the other hand, the class A power amplifier is less prone to the crossover distortion so that it is superior to the class B power amplifier so far as the sound quality is concerned. However, in comparison to the class B power amplifier, the idling current is so increased that the efficiency is inferior, and the working region is so narrow that a large output cannot be obtained.

The class AB power amplifier has the demerits of both the afore-mentioned two types of amplifiers, so that it is hardly adopted, particularly for transistorized power amplifiers, but it is sometimes adopted in case of vacuum tube amplifiers.

Accordingly, it has been in practice to provide class A, class B or class AB amplifier circuits separately so that a single amplifier unit includes only one mode amplifier, therefore a user should select either one out of separate models according to the use of the amplifier. For example, when it is desired to produce sound of small volume and high quality by using an efficient loudspeaker, the class A power amplifier circuit is used; while for producing sound of large volume from a loudspeaker irrespective of low efficiency or high efficiency, the class B power amplifier circuit is used.

Therefore, in order for a single audio amplifier to be capable of operation in any one of the class A, class B and class AB modes it has heretofore been necessary to assemble amplifier circuits of all these classes in the same amplifier unit, which has been very uneconomical.

An object of this invention, accordingly, is to provide an economical power amplifier for stereophonic systems or the like, which is simple in construction and can be operated either as class A, class B or class AB amplifier by selecting a corresponding one of bias current levels set in a bias setting circuitry provided in a driver stage driving the main power amplifier stage.

Another object of the invention is to provide a power amplifier, which is provided with means for always maintaining the null potential on its output terminal in the vicinity of zero volt irrespective of the operation mode to prevent d-c current from flowing into the loudspeaker to thereby prevent the burning thereof.

A further object of the invention is to provide a power amplifier for stereophonic systems, which permits to select class A, class B and class AB operation modes of its power amplifier stage through mere switching operation of a selector switch.

A still further object of the invention is to provide a power amplifier for stereophonic systems, which is provided with means for automatically switching working source voltages corresponding to the class A, class B and class AB operation modes of the power amplifier stage and associated circuit in an interlocked relation to the switching action of the select switch.

A yet further object of the invention is to provide a power amplifier for stereophonic systems, in which the selector switch is adapted to be short-circuited for a certain period when it is switched for switching the class B amplifier operation mode of the power amplifier stage over to the class A or class AB operation mode to thereby protect the power amplifier stage elements.

The power amplifier for stereophonic systems featured by the invention comprises a power amplifier stage, a driver stage for driving the power amplifier stage, and a bias setting circuitry including switching means for selectively switching bias values to be supplied to the driver stage for rendering class A, class B and class AB amplifier operation modes of the amplifier stage to thereby select one of the operation modes.

The above and other objects, features and obtainable effects according to the invention will become more apparent from the following description of preferred embodiments of the invention when the same is read in conjunction with the accompanying drawings, in which.

Figure 1:
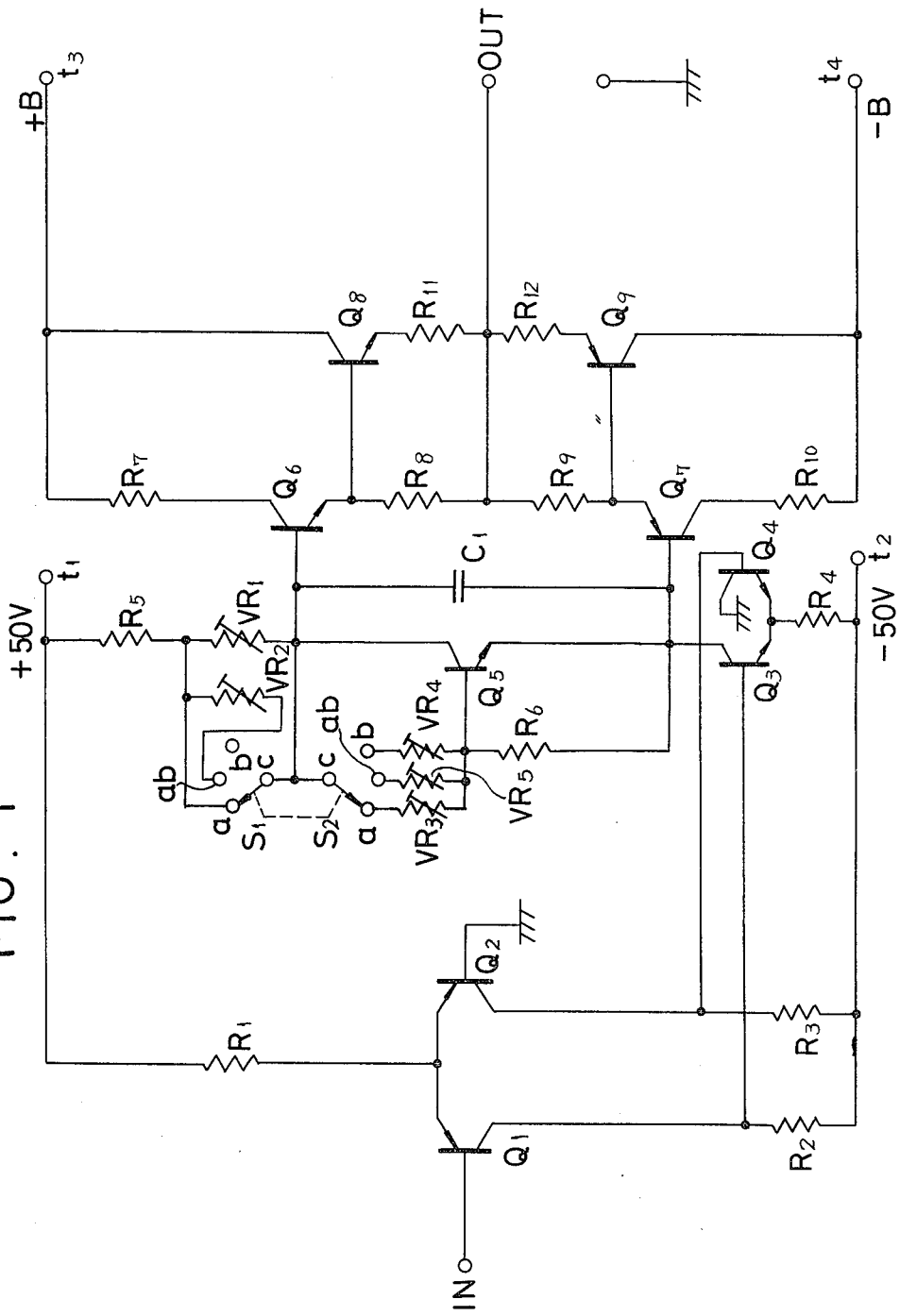
FIG. 1 is a circuit diagram showing an embodiment of the power amplifier according to the invention.

FIG. 1 shows an embodiment of the power amplifier according to the invention. This power amplifier is used for a single channel, for instance for left or right channel of the stereophonic system. In the Figure, reference character IN designates an input terminal.

An audio frequency signal is coupled to a input terminal IN, which is connected to the base of a transistor $Q_1$. The transistor $Q_1$ constitutes, together with another transistor $Q_2$, a common emitter resistor $R_1$ and collector load resistors $R_2$ and $R_3$, a differential amplifier, which serves as a pre-stage amplifier to amplify the audio frequency signal coupled to the input terminal IN.

Both the transistors $Q_1$ and $Q_2$ have their emitters commonly connected through the resistor $R_1$ to a terminal $t_1$. The terminal $t_1$ is adapted to be connected to the positive terminal of a d-c voltage source (not shown) and held at a positive potential, for instance +50 volts.

The collectors of the transistors $Q_1$ and $Q_2$ are respectively connected through the resistors $R_2$ and $R_3$ to a terminal $t_2$. The terminal $t_2$ is adapted to be held at a predetermined negative potential, for instance, −50 volts.

Another differential amplifier stage including transistors $Q_3$ and $Q_4$ and a resistor $R_4$ is coupled to the above-mentioned differential amplifier stage. A resistor is a collector load for the transistor $Q_3$, and a transistor $Q_5$ is for temperature compensation. An adjustable resistor $VR_1$ is inserted between the resistor $R_5$ and a collector of the transistor $Q_5$ for adjustment of the load resistance value.

A switch $S_1$ having stationary contacts $a$, $ab$ and $b$ and a movable contact $c$ is ganged with another switch $S_2$ having stationary contacts $a$, $ab$ and $b$ and a movable contact $c$. The switch $S_1$ has its fixed contact $a$ connected to the juncture between the resistor $R_5$ and the variable resistor $VR_1$, its fixed contact $ab$ connected via an adjustable resistor $VR_2$ to the same juncture, its fixed contact $b$ not connected, and its movable contact $c$ connected to the collector of the transistor $Q_5$. The switch $S_2$ has its movable contact $c$ connected to the same collector, its fixed contacts $a$, $ab$ and $b$ respectively connected via respective adjustable resistors $VR_3$, $VR_5$ and $VR_4$ to the base of the transistor $Q_5$, which base in turn is connected via a resistor $R_6$ to the emitter of the same transistor $Q_5$. Across the collector and the emitter is connected a capacitor $C_1$ for a-c bypassing. Thus constituted is a base bias setting circuitry for the succeeding driver stage transistors. For operating the power amplifier as class A amplifier the movable contacts $c$ of the switches $S_1$ and $S_2$ are thrown to the fixed contacts $a$, for class B to the fixed contacts $b$, and for class AB to the fixed contacts $ab$.

Transistors $Q_6$ and $Q_7$ constitute the driver stage. In this embodiment, the transistor $Q_6$ is a n-p-n transistor, and the transistor $Q_7$ is a p-n-p transistor. The transistor $Q_6$ has its base connected directly to the collector of the transistor $Q_5$, and the transistor $Q_7$ has its base connected directly to the emitter of the transistor $Q_5$. The collector of the transistor $Q_6$ is connected through a resistor $R_7$ to a terminal $t_3$, which is adapted to be held at a positive power potential, $+B$, for instance of $+50$ volts. The emitter of the transistor $Q_6$ is connected through resistor $R_8$ and $R_9$ in series with one another to the emitter of the transistor $Q_7$, whose collector in turn is connected through a resistor $R_{10}$ to a terminal $t_4$, which is adapted to be held at a negative power potential $-B$, for instance of $-50$ volts.

The emitters of the transistors $Q_6$ and $Q_7$ are connected respectively to the bases of respective transistors $Q_8$ and $Q_9$. The transistor $Q_8$ is an n-p-n transistor, and the transistor $Q_9$ is a p-n-p transistor. Both the transistors $Q_8$ and $Q_9$ are connected in complementary symmetry fashion and constitute a power amplifier stage. Resistors $R_{11}$ and $R_{12}$ in series with one another are connected between the emitters of the transistors $Q_8$ and $Q_9$. The juncture between the resistors $R_8$ and $R_9$ as well as the juncture between the resistors $R_{11}$ and $R_{12}$ is connected to an output terminal OUT.

The output terminal OUT is adapted to be normally held at a potential of substantially zero volt with respect to the ground, and a loudspeaker is adapted to be connected as the load of the power amplifier to the output terminal OUT. The collector of the transistor $Q_8$ is connected to the terminal $t_3$, and the collector of the transistor $Q_9$ to the terminal $t_4$.

The operation of the power amplifier of the above construction embodying the invention will now be described. An audio frequency signal coupled to the input terminal IN is first voltage amplified through the differential amplifier of the transistors $Q_1$ and $Q_2$ and further voltage amplified through the differential amplifier of the transistors $Q_3$ and $Q_4$, the output being taken out from the collector of the transistor $Q_3$.

This output is coupled to the base of the collector $Q_7$ and it is also coupled through the capacitor $C_1$ to the base of the transistor $Q_6$. Thus, the transistors $Q_6$ and $Q_7$ operate with respective positive and negative signals for amplifying their respective input signal, and the amplified output taken from the emitter of the transistors $Q_6$ and $Q_7$ is used to drive the respective transistors $Q_8$ and $Q_9$ in the last power amplifier stage.

In the above way, the audio frequency signal coupled to the input terminal IN is power supplied to produce output at the output terminal OUT for driving the loudspeaker to be connected to the output terminal OUT.

In the power amplifier having the above function, the driver stage of transistors $Q_6$ and $Q_7$ and the power amplifier stage of transistors $Q_8$ and $Q_9$ can operate as class A, class B or class AB amplifier depending upon the state of the ganged switches $S_1$ and $S_2$ as will be described hereinafter.

For operation as class A amplifier, the switches $S_1$ and $S_2$ are thrown to the position $a$, i.e., the movable contacts $c$ are connected to the fixed terminal $a$. In this state, the bias voltage is supplied from the terminal $t_1$ through the resistor $R_5$ and the variable resistor $VR_3$ to the base of the transistor $Q_5$. In this case, the variable resistor $VR_3$ is adjusted such that the base bias voltage on the transistor $Q_5$ is reduced compared to that in case of the class B amplifier operation. By so doing, the collector-emitter current in the transistor $Q_5$ is reduced to render the transistor $Q_5$ less conductive thereby increasing the potential difference between the collector and the emitter of the transistor $Q_5$, and in turn increasing the base bias for the transistors $Q_6$ and $Q_7$ and hence increasing the current flowing in the transistors $Q_6$ and $Q_9$ in the driver stage and the power amplifier stage. In this way, the class A amplifier operation of the driver stage and the power amplifier stage can be obtained.

For operation as class B amplifier, the switches $S_1$ and $S_2$ are thrown to the position $b$, i.e., the movable contacts $c$ are now connected to the fixed contacts $b$. In this state, the bias voltage is supplied from the terminal $t_1$ through the resistor $R_5$ and variable resistors $VR_1$ and $VR_4$ to the base of the transistor $Q_5$, and the variable resistor $VR_4$ is adjusted to have class B amplifying operation of the transistors $Q_6$ to $Q_9$ in the driver stage and in the power amplifier stage.

The variable resistor $VR_1$ is provided for adjusting the null potential on the output terminal OUT at the time of the class B operation. More particularly, it is provided for preventing the departure of the null potential on the output terminal OUT to the extent corresponding to the decrease of the base bias voltage on the transistors $Q_6$ and $Q_7$ when causing the class B amplifying operation of the transistors $Q_8$ and $Q_9$.

While the operation of the above embodiment as class A amplifier and class B amplifier has been shown, it is also possible to obtain class AB amplifier operation by throwing the switches to the position $ab$. To this end, a further variable resistors $R_2$ and $R_5$ are provided for the class AB amplifier operation purpose so that they may be switched by the switches $S_1$ and $S_2$.

Figure 2:
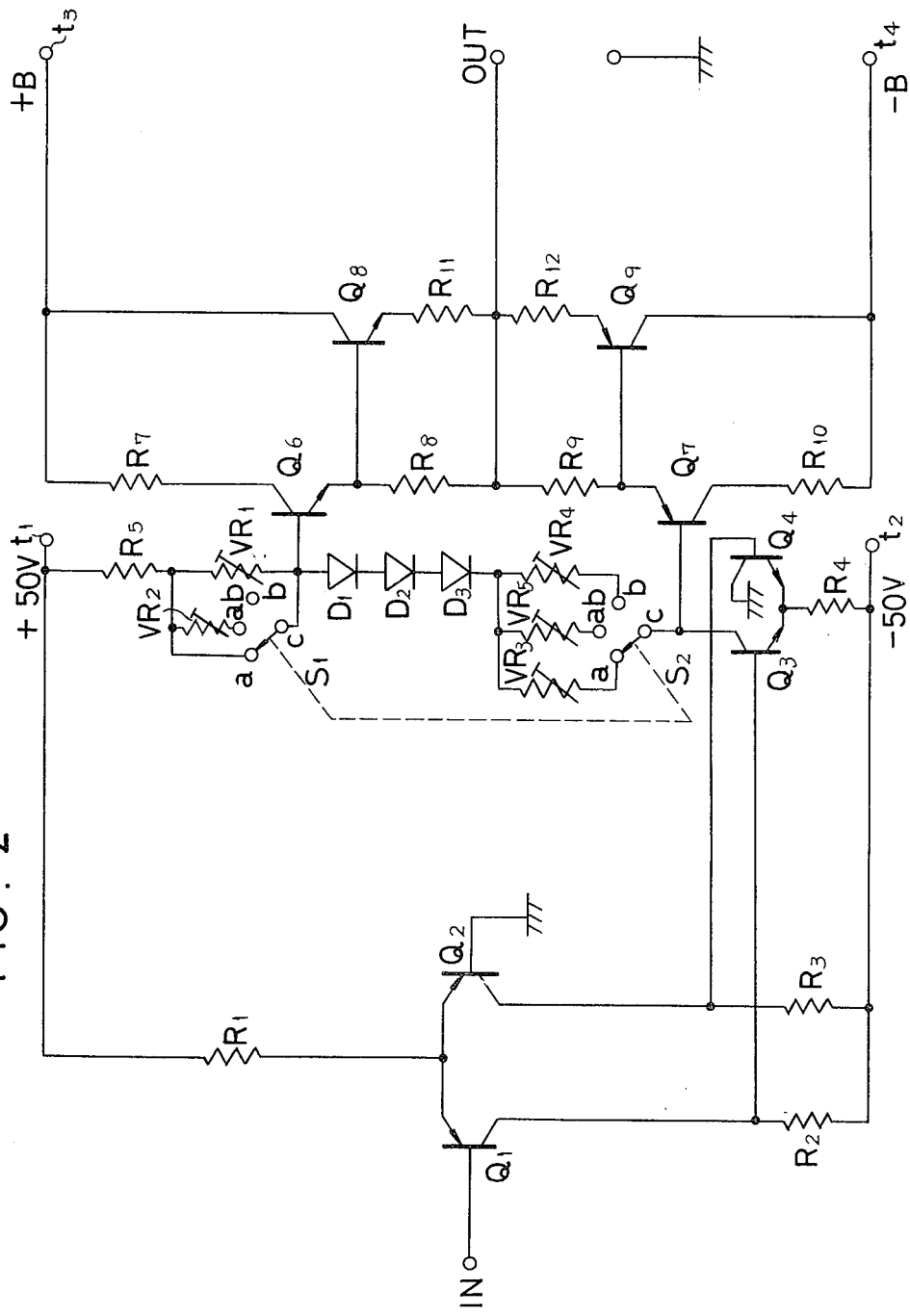
FIGS. 2 and 3 are circuit diagrams showing other embodiments of the power amplifier according to the invention.

FIG. 2 shows a second embodiment of the invention. In the Figure, the same parts as those in FIG. 1 are designated by the same reference characters, and they are not described in any further. In this embodiment, diodes $D_1$ to $D_3$ are used in place of the temperature compensation transistor $Q_5$ in the preceding embodiment of FIG. 1.

The diodes $D_1$ to $D_3$ are connected in series with one another. The anode of the diode $D_1$ is connected to the base of the transistor $Q_6$, and it is also connected through variable resistor $VR_1$ and resistor $R_5$ to terminal $t_1$. The cathode of the diode $D_3$ is connected to one end of variable resistors $VR_3$ to $VR_5$, whose other ends are in turn connected to respective fixed contacts $a$, $b$ and $ab$ of switch $S_2$. The movable contact $c$ of the switch $S_2$ is connected to the collector of the transistor $Q_3$ and to the base of the transistor $Q_7$.

Similar to the preceding embodiment of FIG. 1, the switches $S_2$ is ganged together with switch $S_1$. In the instant embodiment, the resistor $R_6$ and capacitor $C_1$ in the embodiment of FIG. 1 are omitted.

In this embodiment, the variable resistors $VR_3$ to $VR_5$ may be switched by the switch $S_2$ to set the base bias on the transistors $Q_6$ to $Q_7$ in the driver stage so as to determine the operation mode of these transistors $Q_6$ and $Q_7$ and the transistors $Q_8$ and $Q_9$ in the power amplifier stage as class A, class B and class AB amplifier.

Figure 3:
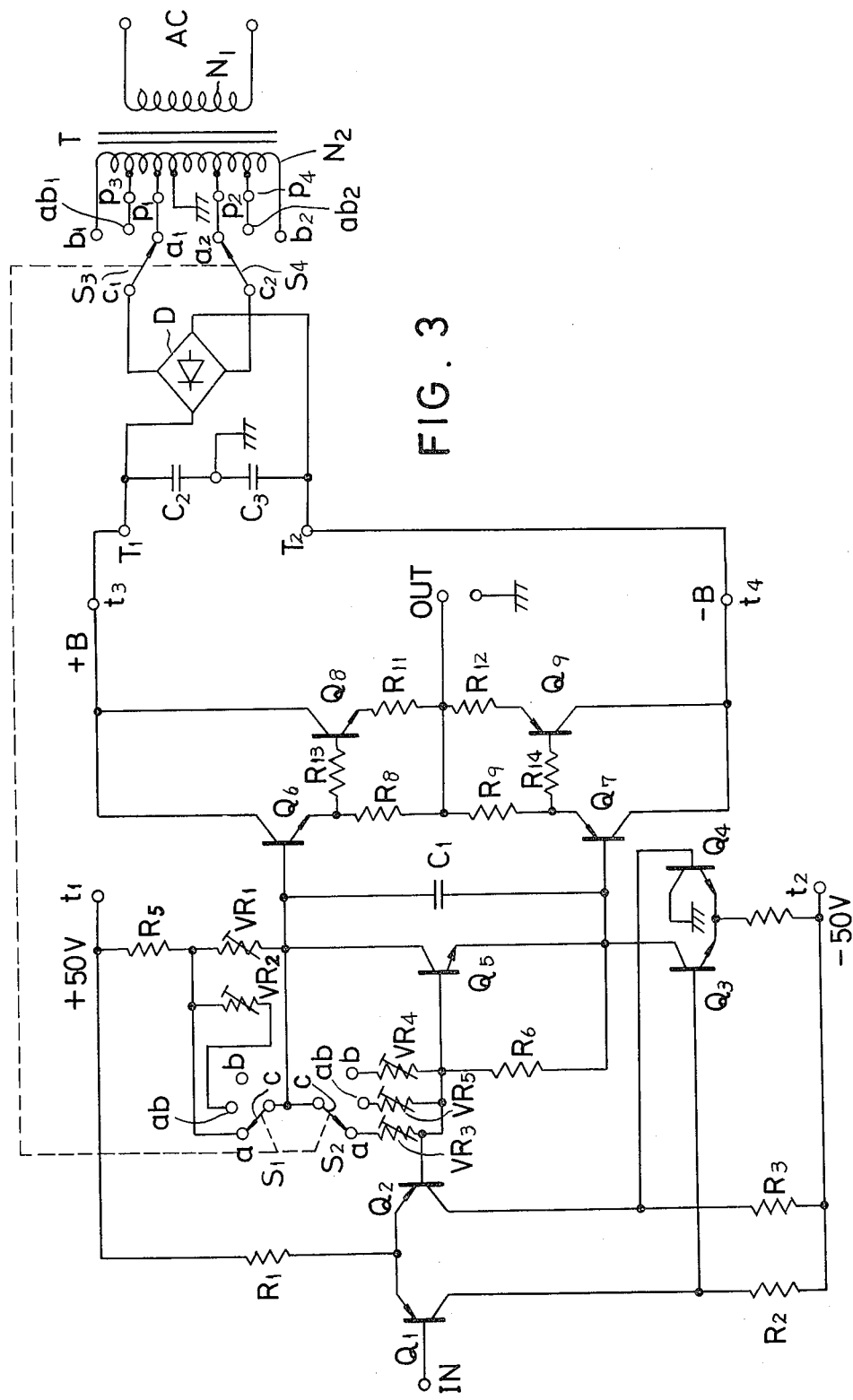

FIG. 3 shows a third embodiment of the invention. Like the preceding embodiments, this embodiment permits to obtain the operation of the power amplifier stage as class A, class B and class AB amplifier by switching switches $S_1$ and $S_2$. Also, in this embodiment working power source voltage corresponding to the class A, class B and class AB operation modes of the power amplifier stage and associated circuit can be switched in an interlocked relation to the switching action of the switches $S_1$ and $S_2$. Further, means is provided for protecting the elements of the power amplifier stage when switching the class B operation over to the class A or class AB operation.

In this embodiment, the terminal $t_1$ is connected to +50V source and the terminal $t_3$ to a positive terminal $T_1$ of the power supply circuit, and the terminals $t_2$ and $t_4$ are connected respectively to −50V source and to a negative terminal $T_2$ of the power supply circuit.

The primary winding $N_1$ of a transformer T of the power supply is adapted to be connected across an a-c power source not shown. The secondary winding $N_2$ of the transformer T has four taps $p_1$ to $p_4$. These taps $p_1$ to $p_4$ are connected to respective fixed contacts $a_1$, $a_2$, $ab_1$ and $ab_2$ of the switches $S_3$ and $S_4$ interlocked to the afore-mentioned switches $S_1$ and $S_2$.

The opposite ends of the secondary winding $N_2$ of the transformer T are connected to respective other fixed contacts $b_1$ and $b_2$ of the switches $S_3$ and $S_4$. Depending upon the mode of operation of the power amplifier as class A amplifier, as class B amplifier or as class AB amplifier, the fixed contacts $a_1$, $a_2$; $b_1$, $b_2$; and $ab_1$, $ab_2$ of the switches $S_3$ and $S_4$ can be selectively connected to the movable contacts $c_1$ and $c_2$ thereof to take out source voltage for class A, class B or class AB operation.

The movable contacts $c_1$ and $c_2$ of the switches $S_3$ and $S_4$ are connected to the input side of a rectifier circuit D, and capacitors $C_2$ and $C_3$ are connected in series with each other between the positive and negative output terminals of the rectifier D. The connection point between both the capacitors $C_2$ and $C_3$ is connected to earth. Thus, positive and negative d-c voltages appear at the opposite output terminals of the rectifier D, that is, the afore-mentioned positive and negative terminals $T_1$ and $T_2$.

To operate the transistors $Q_6$ to $Q_9$ in the driver stage and the power amplifier stage in this embodiment as class B amplifier, the switches $S_1$ and $S_2$ are thrown to the position $b$, i.e., the movable contacts $c$ are connected to the fixed contacts $b$. By so doing, the power source side switches $S_3$ and $S_4$ interlocked to both the switches $S_1$ and $S_2$ are simultaneously actuated, with their movable contacts $c_1$ and $c_2$ thrown to the respective fixed contacts $b_1$ and $b_2$, whereby an a-c voltage of a high level is made to appear across the input terminals of the rectifier circuit D. Thus, d-c voltages required for the class B operation, for instance voltages of +50 volts and −50 volts, appear at the output terminals of the rectifier D, i.e., the positive and negative terminals $T_1$ and $T_2$. These positive and negative voltages are supplied as working source voltage respectively through the terminals $t_3$ and $t_4$ to the driver stage and the power amplifier stage. The voltage appearing at the terminal $t_1$ is applied via the resistor $R_5$ and the variable resistor $VR_1$ to the collector of the transistor $Q_5$ for its collector-to-emitter current and further via the variable resistor $VR_4$ to its base. The variable resistors $VR_1$ and $VR_4$ are so adjusted that the voltage drop between the collector and the emitter of the transistor $Q_5$ permits the class B amplifying operation of the transistors $Q_6$ to $Q_9$ in the driver stage and the power amplifier stage.

To operate the power amplifier of this embodiment as class A amplifier, the movable contact $c$ of the switch $S_1$ is thrown into contact with the fixed contact $a$ thereof and the movable contact $c$ of the switch $S_2$ into contact with the fixed contact $a$ thereof.

If in the class A operation the same source voltage as that supplied in the class B operation were supplied to the power amplifier circuit, particularly the power amplifier stage, the collector current in the transistors $Q_8$ and $Q_9$ would be increased to result in increased collector loss and sometimes in the rupture or deterioration of the transistors due to heat generation.

In the instant embodiment, accordingly, the working power source voltage is adapted to be switched when the operation mode of this power amplifier circuit is switched from the class B amplifier operation to the class A or Class AB amplifier operation.

More particularly, by switching the switches $S_1$ and $S_2$ for causing the class A operation the power source side switches $S_3$ and $S_4$ interlocked to the switches $S_1$ and $S_2$ are also actuated, with their movable contacts $c_1$ and $c_2$ thrown over to the fixed contacts $a_1$ and $a_2$ connected to the taps of the transformer secondary. As a result, an a-c voltage lower than that appeared in case of the class B operation appears across the input terminals of the rectifier D. Thus, the d-c voltages suited for the class A operation, for instance voltages of +20 volts and −20 volts, appear at the terminals $T_1$ and $T_2$. These positive and negative voltages are supplied as working source voltage respectively through the terminals $t_3$ and $t_4$ to the driver stage and the power amplifier stage.

However, if the working power source voltage for the differential amplifier stages preceding the driver stage is also switched with the switching of that for the driver stage, the bias voltage for the differential amplifier stages would depart, so that it becomes necessary to further adjust this bias voltage. Accordingly, in this embodiment always a constant voltage (+50 and −50) is adapted to be supplied as the working voltage for the differential amplifier stages irrespective of the switching of the operation mode of the power amplifier circuit to class A, class B or class AB operation.

Further, in this embodiment the switch $S_2$ is so designed to be short-circuited for a certain period at the time of its switching. That is the movable contact bridges the adjacent fixed contacts amidst the travel from one fixed contact to another. This is because the switches $S_1$ to $S_4$ may not be switched exactly simultaneously even if they are installed on the same shaft. Although there is no problem if the switch $S_2$ is switched exactly simultaneously with the switches $S_3$ and $S_4$ or slightly after the switches $S_3$ and $S_4$, a serious problem will be presented if the switch $S_2$ will be switched earlier than the switches $S_3$ and $S_4$. In such case, the voltage for the class B operation will remain to prevail in the power amplifier stage even though the base bias voltage on the drive stage has been switched to that for the class A operation. In this case, the collector loss in the transistors $Q_8$ and $Q_9$ in the power amplifier stage would be increased, which is likely to lead to such inconvenience as rupture of these transistors.

With the short-circuiting time provided at the time of switching of the switch $S_2$ as mentioned earlier, at the time of switching over to the class A operation the sum of the resistance of the resistor $R_5$ and the combined resistance of the variable resistors $VR_3$ and $VR_5$ or $VR_5$ and $VR_4$ will be inserted between the terminal $t_1$ and the base of the transistor $Q_5$. Thus, the current through the transistors $Q_8$ and $Q_9$ will be reduced from the level at the time of the B class operation, so that the excessive loss in the transistors may be prevented.

While the operation of the above embodiment has been described in connection with the class A and class B amplifier operation modes, it is also possible to obtain class AB amplifier operation. To this end, further variable resistors $VR_2$ and $VR_5$ are provided for the class AB amplifier operation so that they may be switched by the switches $S_1$ and $S_2$.

Figure 4:
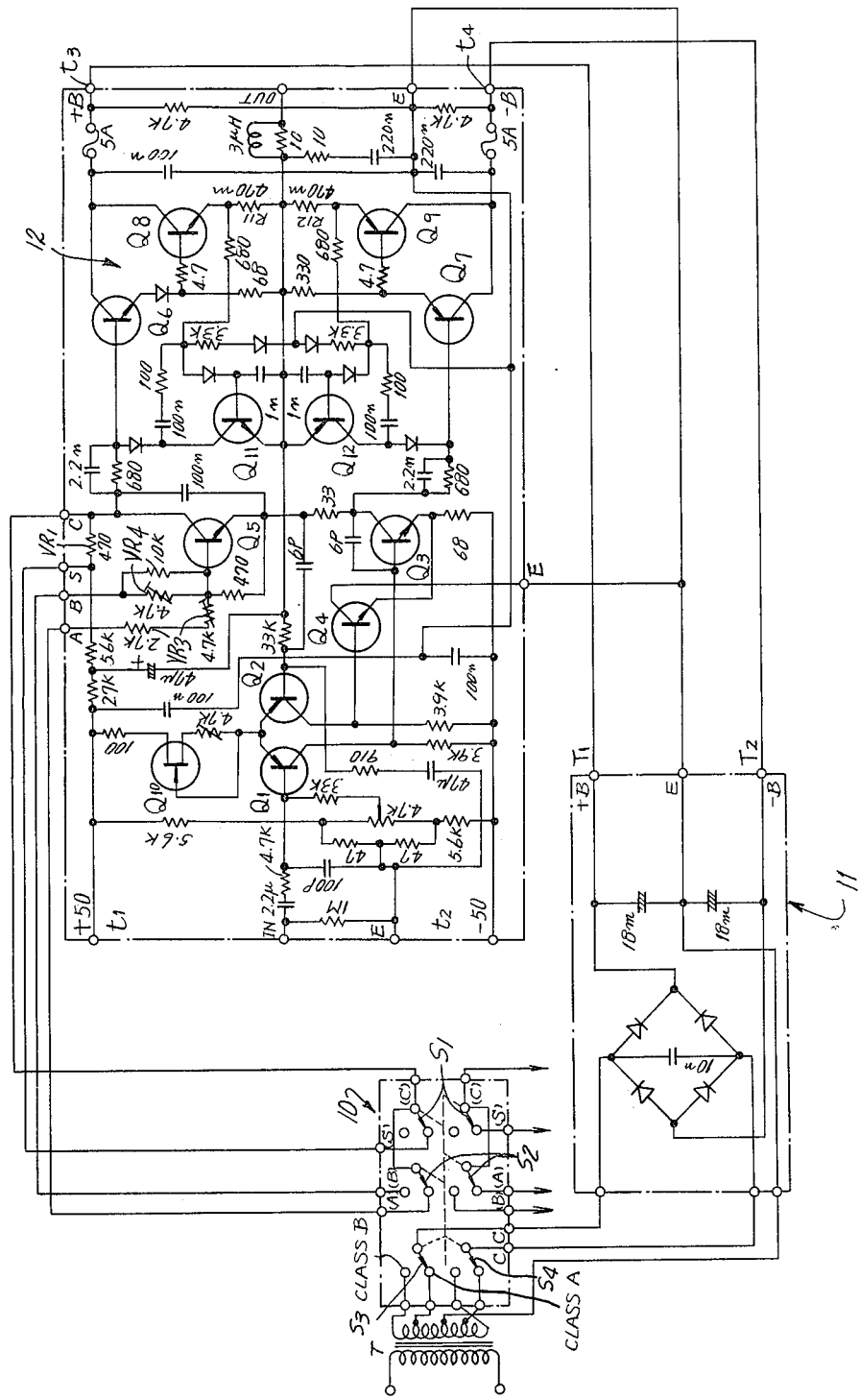
FIG. 4 is a circuit diagram showing an embodiment of the power amplifier according to FIG. 3.

FIG. 4 is a circuit diagram showing an embodiment according to FIG. 3. In the Figure, reference character 10 designates a switching circuit, which takes out a switching of the class A and class B amplifier mode of the power amplifier connected to the output side of a power source transformer T and a source voltage suited for the said mode. In the Figure, reference character 11 designates a rectifier circuit connected through the switch for switching the source voltage in the said switching circuit 10. This rectifier circuit 11 has +B and −B sources, which are respectively connected to terminals $t_3$ and $t_4$ of a power amplifier circuit 12.

In the power amplifier circuit 12, the same parts as those in FIG. 3 are designated by the same reference characters, and they are not described in any further. Only the different parts are described as follows.

A field effect transistor $Q_{10}$ has its source and drain, respectively connected to the juncture between the emitters of transistors $Q_1$ and $Q_2$ of a differential amplifier and +50V source terminal $t_1$ to serve as a constant current source for the differential amplifier, thus obtaining a high common mode rejection ratio of the differential amplifier.

Further, a transistor $Q_{11}$ and a transistor $Q_{12}$ are provided for protecting transistors $Q_8$ and $Q_9$ of the power stage from an overcurrent. The transistor $Q_{11}$ has its emitter connected to output line 21 and its collector connected to the base of the transistor $Q_6$. The transistor $Q_{12}$ has its emitter connected to output line 21 and its collector connected to the base of the transistor $Q_7$.

Furthermore, each base of the said transistors $Q_{11}$ and $Q_{12}$ is respectively connected to the emitters of the transistors $Q_8$ and $Q_9$ in the power amplifier stage. The overcurrent flow to the transistors $Q_8$ and $Q_9$ is picked up by resistors $R_{11}$ and $R_{12}$ and then the transistors $Q_{11}$ and $Q_{12}$ are turned on. Each base of the transistors $Q_6$ and $Q_7$ is connected to earth so as to let the transistors $Q_6$ and $Q_7$ be off. By so doing, the transistors $Q_8$ and $Q_9$ are protected from the overcurrent.

We claim:

1. A power amplifier comprising:
   a power amplifier stage,
   a driver stage coupled to said power amplifier stage for driving said power amplifier stage,
   variable biasing means coupled to said driver stage and including switching means for selectively switching bias values of said driver stage corresponding to different classes of amplifier operation modes to thereby select one of said operation modes, and
   compensating means included in said biasing means for developing a null potential and compensating for drift of the null point in the output of said power amplifier from zero volts, said null potential being otherwise changed with the switching of the different classes of amplifier operation modes.

2. A power amplifier comprising:
   a power amplifier stage,
   a driver stage coupled to said power amplifier stage for driving said power amplifier stage,
   variable biasing means coupled to said driver stage and including first switching means for selectively switching bias values of said driver stage corresponding to different classes of amplifier operation modes of said power amplifier stage to thereby select one of said operation modes, and
   second switching means for switching working power source voltages supplied to said power amplifier stage corresponding to the different operation modes of said power amplifier stage, corresponding to the different operation modes of said power amplifier stage,
   said first and second switching means being ganged to cause said working voltage to be higher and said bias value to be lower for one class of operation under less deep biasing than any other.

3. The power amplifier according to claim 2, wherein said working power source voltages are selected in correspondence to the class A, class B and class AB operation modes of said driver stage and said power amplifier stage by said second switching means.

4. The power amplifier according to claim 2 wherein said first switching means is short-circuited for a certain period when it is switched to prevent the said higher working source voltage of the said one class of operation from being supplied to the power amplifier stage while the power amplifier stage is in a bias state for another class of operation.

5. A power amplifier capable of operating selectively in the class B mode and in at least one other class mode including at least one of the class A and class AB modes, comprising:
   power amplifier means having working voltage terminal means,
   driver means having input terminal means and working voltage terminal means,
   means direct-current coupling said driver means to said amplifier means,
   variable biasing means including first switching means having at least two settings and being connected to said input terminal means of said driving means respectively for increasing the bias on said driver means and hence also on said power amplifier means from a given level which causes operation of said power amplifier means in said class B mode to a higher level to cause operation of said power amplifier means in said other class mode and for decreasing the bias on said driver means and hence on said amplifier means from said higher level of said other class mode to said given level for class B operation of said power amplifier means, variable working voltage means including second switching means having at least two settings and being connected to at least said working voltage terminal means of said power amplifier means for delivering thereto a relatively high working voltage in one setting of said second switching means and a relatively low working voltage in the other of its said settings, and means interlocking said first and second switching means for causing:

(a) said second switching means to be in said relatively low working voltage setting when said first switching means setting causes said increased bias for said other class operating mode and (b) said second switching means to be in said relatively high working voltage setting when said first switching means setting causes decreased bias for class B operation to obtain higher power from the higher working voltage delivered to said amplifier means during the class B operation than during operation in the said other class mode.

6. A power amplifier as in claim 5 wherein said other class mode is class A and wherein said variable biasing means and variable working voltage means have in their respective switching means a third setting for respectively delivering to said driver means a bias which is intermediate said given and higher level to cause the class AB operating mode, said third setting of said second switching means being operative to deliver from said variable working voltage means to the working voltage terminal means of said amplifier means a working voltage which is intermediate said high and low working voltages during said class AB operating mode.

7. A power amplifier as in claim 5 including means for preventing delivery of said relatively high working voltage to said power amplifier means while said amplifier means is receiving only said higher level bias during switching of said first and second switching means.

8. A power amplifier as in claim 5 wherein said first switching means is at least partially shortcircuited during the changeover from one operating class to another.

9. A power amplifier as in claim 5 including a variable resistance connected to said first switching means and being paralleled thereby when the first switching means causes said other operating class mode and being otherwise operative for at least during the class B operating mode to adjust the amplifier means output to a null potential and to prevent the departure thereof from said null potential to the extent corresponding to the decrease in said bias on said driver means when causing said class B operating mode of said amplifier means.

10. A power amplifier as in claim 5 and further including means connected from the output of said power amplifier means to said input terminal means of the driver means for protecting said amplifier means from overcurrent.

11. A power amplifier capable of operating selectively in the class B mode and in at least one other class mode including at least one of the class A and class AB modes, comprising:

a push-pull amplifier stage having two complementary interconnected power amplifying elements each having working voltage terminal means, a driver stage having two interconnected follower elements each having input terminals means and working voltage terminal means, means direct-current coupling said driver stage to said amplifier stage including said follower elements to said amplifying elements respectively, variable biasing means including first switching means having at least two settings and being connected to said input terminal means of said driver stage respectively for increasing the bias on said follower elements and hence also on said amplifying elements from a given level which causes operation of said power amplifier stage in said class B mode to a higher level to cause operation of said power amplifier stage in said other class mode and for decreasing the bias on said follower elements and hence also on said amplifying elements from said higher level of said other class mode to said given level for class B operation of said power amplifier stage, variable working voltage means including second switching means having at least two settings and being connected to at least said working voltage terminal means of said power amplifier for delivering thereto a relatively high working voltage in one setting of said second switching means and a relatively low working voltage in the other of its said settings, and means interlocking said first and second switching means for causing (a) said second switching means to be in said relatively low working voltage setting when said first switching means setting causes said increased bias for said other class operating mode and (b) said second switching means to be in said relatively high working voltage setting when said first switching means setting causes decreased bias for class B operation to obtain higher power from the higher working voltage delivered during the class B operation than during operation in the said other class mode.

12. A power amplifier as in claim 11 including a constant voltage source for supplying said variable biasing means with a voltage that stays the same regardless of the setting of said first and second switching means.

13. A power amplifier as in claim 12 including transistor means having collector, emitter and base terminals with the collector and emitter terminals being connected respectively to the said input terminal means of said two interconnected follower elements, said variable biasing means including said transistor means and further including first and second ganged switches each having a switch arm and at least first and second contact points, said switch arms being connected together and to the one of said input terminal means to which said collector means is connected, two different variable resistances respectively connected at one end to said first and second contacts of said second switch and commonly at their opposite ends to said base terminal, third resistance means including a third variable resistance connected between said constant supply voltage and said one input terminal means, means connecting said third resistance means to the first contact of said first switch for shorting said third variable resistance while said second switch arm is on its first contact, said second contact of said first switch being open to effect said class B operating mode when said first and second switches are on their second contacts, and said third variable resistance being operative during the class B operating mode to adjust the output of said two power amplifying elements to a null potential and to prevent the departure of said output from said null potential to the extent corresponding to the decrease in said bias on said follower elements when causing said class B operating mode of said power stage amplifying elements.

14. A power amplifier as in claim 13 wherein adjacent contacts of said second switch are shortcircuited during the changeover from one operating class to another.

15. A power amplifier as in claim 14 including further transistor means connected from the output terminals of said amplifying elements to said input terminals of said follower elements for protecting said amplifying elements from overcurrent.

16. A power amplifier as in claim 15 including first and second differential amplifiers, said second differential amplifier having inputs connected to the respective outputs of said first differential amplifier and having an output connected to the input terminal means of the follower element to which the emitter means of said transistor means is connected, and a field effect transistor connected between said first differential amplifier and said constant supply source to cause a common mode rejection ratio of said first differential amplifier.

17. A power amplifier capable of operating selectively in the class B mode and in at least one other class mode including at least one of the class A and class AB modes, comprising:

power amplifier means having working voltage terminal means, driver means having input terminal meand and working voltage terminal means, means direct-current coupling said driver means to said amplifier means, variable biasing means including first switching means having at least two settings and being connected to said input terminal means of said driving means respectively for:
(1) shifting the bias on said driver means and hence also on said power amplifier means from a given level, which level causes operation of said power amplifier means in said class B mode, to a higher level to cause operation of said power amplifier means in said other class mode with increased operating current, and
(2) shifting the bias on said driver means and hence on said amplifier means from said higher level of said other class mode to said given level to cause class B operation of said power amplifier means with decreased operating current, variable working voltage means including second switching means having at least two settings and being connected to at least said working voltage terinal means of said power amplifier means for delivering thereto a relatively high working voltage in one setting of said second switching means and a relatively low working voltage in the other of its said settings, and means interlocking said first and second switching means for causing:
(a) said second switching means to be in said relatively low working voltage setting when said first switching means setting causes operation in said other class operting mode as aforesaid, and
(b) said second switching means to be in said relatively high working voltage setting when said first switching means setting causes class B operation for obtaining higher power from the higher working voltage delivered to said amplifier means during the class B operation than during operation in the said other class mode.

18. A power amplifier as in claim 17 wherein said second switching means is connected to the said working voltage terminal means of said driver means for delivering thereto the said relatively high and low working voltages respectively in correspondence with the said delivery thereof to said power amplifier means.

19. A power amplifier capable of operating selectively in the class B mode and in at least one other class mode including at least one of the class A and class AB modes, comprising:

a push-pull power amplifier stage having two complementary interconnected power amplifying elements each having working voltage terminal means, a driver stage having two interconnected follower elements each having input terminal means and working voltage terminal means, means direct-current coupling said driver stage to said amplifier stage including said follower elements to said amplifying elements respectively, variable biasing means including first switching means having at least two settings and being connected to said input terminal means of said driver stage respectively for:
(1) shifting the bias on said follower elements and hence also on said amplifying elements from a given level, which level causes operation of said power amplifier stage in said class B mode, to a higher level to cause operation of said power amplifier stage in said other class mode with increased operating current, and
(2) shifting the bias on said follower elements and hence also on said amplifying elements from said higher level of said other class mode to said given level to cause class B operation of said power amplifier stage with decreased operating current, variable working voltage means including second switching means having at least two settings and being connected to at least said working voltage terminal means of said power amplifier for delivering thereto a relatively high working voltage in one setting of said second switching means and a relatively low working voltage in the other of its said settings, and means interlocking said first and second switching means for causing:
(a) said second switching means to be in said relatively low working voltage setting when said first switching means setting causes operation in said other class operating mode as aforesaid, and
(b) said second switching means to be in said relatively high working voltage setting when said first switching means setting causes class B operation for obtaining higher power from the higher working voltage delivered during the class B operation than during operation in the said other class mode.

20. A power amplifier as in claim 19 wherein said second switching means is connected to the said working voltage terminal means of each of the said follower elements in said driver stage for delivering thereto the said relatively high and low working voltages respectively in correspondence with the said delivery thereof to said power ampifying elements.

21. A power amplifier as in claim 19 including a constant voltage source for supplying said variable biasing means with a voltage that stays the same regardless of the setting of said first and second switching means.

22. A power amplifier as in claim 21 including transistor means having collector, emitter and base terminals with the collector and emitter terminals being connected respectively to the said input terminal means of said two interconnected follower elements, said varible biasing means including said transistor means and further including first and second ganged switches each having a switch arm and at least first and second contact points, said switch arms being connected together and to the one of said input terminal means to which said collector means is connected, two different variable resistances respectively connected at one end to said first and second contacts of said second switch and commonly at their opposite ends to said base terminal, third resistance means including a third variable resistance connected between said constant supply voltage and said one input terminal means, means connecting said third resistance means to the first contact of said first switch for shorting said third variable resistance while said second switch arm is on its first contact, said second contact of said first switch being open to effect said class B operating mode when said first and second switches are on their second contacts, and said third variable resistance being operative during the class B operating mode to adjust the output of said two power amplifying elements to a null potential and to prevent the departure of said output from said null potential to the extent corresponding to the said bias on said follower elements when causing said class B operating mode of said power stage amplifying elements.

23. A power amplifier as in claim 22 wherein adjacent contacts of said second switch are shortcircuited during the changeover from one operating class to another.

24. A power amplifier as in claim 23 including further transistor means connected from the output terminals of said amplifying elements to said input terminals of said follower elements for protecting said amplifying elemets from overcurrent.

25. A power amplifier as in claim 24 including first and second differential amplifiers, said second differential amplifier having inputs connected to the respective outputs of said first differential amplifier and having an output connected to the input terminal means of the follower element to which the emitter means of said transistor means is connected, and a field effect transistor connected between said first differential amplifier and said constant supply source to cause a common mode rejection ratio of said first differential amplifier.

26. A power amplifier as in claim 17 wherein said other class mode is class A and wherein said variable biasing means and variable working voltage means have in their respective switching means a third setting for respectively delivering to said driver means a bias which is intermediate said given and higher level to cause the class AB operating mode, said third setting of said second switching means being operative to deliver from said variable working voltage means to the working voltage terminal means of said amplifier means a working voltage which is intermediate said high and low working voltages during said class AB operating mode.

27. A power amplifier as in claim 17 including means for preventing delivery of said relatively high working voltage to said power amplifier means while said amplifier means is receiving only said higher level bias during switching of said first and second switching means.

28. A power amplifier as in claim 17 wherein said first switching means is at least partially shortcircuited during the changeover from one operating class to another.

29. A power amplifier as in claim 17 including a variable resistance connected to said first switching means and being paralleled thereby when the first switching means causes said other operating class mode and being otherwise operative for at least during the class B operating mode to adjust the amplifier means output to a null potential and to prevent the departure thereof from said null potential to the extent corresponding to the decrease in said bias on said driver means when causing said class B operating mode of said amplifier means.

30. A power amplifier as in claim 17 and further including means connected from the output of said power amplifier means to said input terminal means of the driver means for protecting said amplifier means from overcurrent.

31. A power amplifier as in claim 5 wherein said second switching means is connected to the said working voltage terminal means of said driver means for delivering thereto the said relatively high and low working voltages respectively in correspondence with the said delivery thereof to said power amplifier means.

32. A power amplifier as in claim 11 wherein said second switching means is connected to the said working voltage terminal means of each of the said follower elements in said driver stage for delivering thereto the said relatively high and low working voltages respectively in correspondence with the said delivery thereof to said power amplifying elements.

33. A power amplifier capable of operating selectively in the class B mode and in at least one other class mode including at least one of the class A and class AB modes, comprising:

power amplifier means having working voltage terminal means, driver means having input terminal means and working voltage terminal means, means direct-current coupling said driver means to said amplifier means, variable biasing means including first means having at least two changeable conditions and being connected to said input terminal means of said driving means respectively for:

(1) increasing the conductivity of said power amplifier means to cause operation of said power amplifier means in said other class mode, and (2) decreasing the conductivity of said amplifier means to cause operation thereof in said class B mode, variable working voltage means including second means having at least two changeable conditions and being connected to at least said working voltage terminal means of said power amplifier means for delivering thereto a relatively high working voltage in one condition of said second means and a relatively low working voltage in another of its said conditions, and means for changing and correlating the operations of said first and second means for causing:
(a) said second means to be in said relatively low working voltage condition when said first means causes said other class operating mode, and
(b) said second means to be in said relatively high working condition when said first means causes class B operation for obtaining higher power from the higher working voltage delivered to said amplifier means during the class B operation than during operation in the said other class mode.

34. A power amplifier as in claim 33 wherein said other class mode is class A and wherein said variable biasing means and variable working voltage means have in their respective first and second means a respective third condition for respectively causing conductivity of said power amplifier means intermediate those for class A and B operating modes to effect the class AB operating mode, said third condition of said second means being operative to deliver from said variable working voltage means to the working voltage terminal means of said amplifier means a working voltage which is intermediate said high and low working voltages during said class AB operating mode.

35. A power amplifier as in claim 33 including means for preventing, during the changing of the said condition of said first and second means, delivery of said relatively high working voltage to said power amplifier means while said amplifier means is operating in said other class mode.

36. A power amplifier as in claim 33 wherein said first means is at least partially shortcircuited during the changeover from one operating class to another.

37. A power amplifier as in claim 33 including a variable resistance connected to said first means and being paralleled by said first means when the first means causes said other operating class mode and being otherwise operative for at least during the class B operating mode to adjust the amplifier means output to a null potential and to prevent the departure thereof from said null potential to the extent corresponding to any decrease in bias on said driver means when causing said class B operating mode of said amplifier means.

38. A power amplifier as in claim 35 wherein said second switching means is connected to the said working voltage terminal means of said driver means for delivering thereto the said relatively high and low working voltages respectively in correspondence with the said delivery thereof to said power amplifier means.

39. A power amplifier as in claim 33 and further including means connected from the output of said power amplifier means to said input terminal means of the driver means for protecting said amplifier means from overcurrent.

40. A power amplifier capable of operating selectively in the class B mode and in at least one other class mode including at least one of the class A and class AB modes, comprising:

a push-pull power amplifier stage having two complementary interconnected power amplifying elements each having working voltage terminal means,
a driver stage having two interconnected follower elements each having input terminal means and working voltage terminal means,
means direct-current coupling said driver stage to said amplifier stage including said follower elements to said amplifying elements respectively,
variable biasing means including first means having at least two changeable conditions and being connected to said input terminal means of said driver stage respectively for:
(1) increasing the conductivity of said amplifying elements to cause operation of said power amplifier stage in said other class mode, and
(2) decreasing the conductivity of said amplifier elements to cause operation of said power amplifier stage in said class B mode,
variable working voltage means including second means having at least two changeable conditions and being connected to at least said working voltage terminal means of said power amplifier for delivering thereto a relatively high working voltage in one condition of said second means and a relatively low working voltage in another of its said conditions, and
means for changing and correlating the operations of said first and second means for causing:
(a) said second means to be in said relatively low working voltage condition when said first means causes said other class operating mode, and
(b) said second means to be in said relatively high working voltage condition when said first means condition causes class B operation for obtaining higher power from the higher working voltage delivered during the class B operation than during operation in the said other class mode.

41. A power amplifier as in claim 40 including a constant voltage source for supplying said variable biasing means with a voltage that stays the same regardless of the condition of said first and second means.

42. A power amplifier as in claim 41 including transistor means having collector, emitter and base terminals with the collector and emitter terminals being connected respectively to the said input terminal means of said two interconnected follower elements,
said variable biasing means including said transistor means and said first means including first and second ganged switches each having a switch arm and at least first and second contact points,
said switch arms being connected together and to the one of said input terminal means to which said collector means is connected,
two different variable resistances respectively connected at one end to said first and second contacts of said second switch and commonly at their opposite ends to said base terminal,
third resistance means including a third variable resistance connected between said constant supply voltage and said one input terminal means,
means connecting said third resistance means to the first contact of said first switch for shorting said third variable resistance while said second switch arm is on its first contact,
said second contact of said first switch being open to effect said class B operating mode when said first and second switches are on their second contacts, and said third variable resistance being operative during the class B operating mode to adjust the output of said two power amplifying elements to a null potential and to prevent the departure of said output from said null potential to the extent corresponding to the decrease in said bias on said follower elements when causing said class B operating mode of said power stage amplifying elements.

43. A power amplifier as in claim 42 wherein adjacent contacts of said second switch are shortcircuited during the changeover from one operating class to another.

44. A power amplifier as in claim 43 including further transistor means connected from the output terminals of said amplifying elements to said input terminals of said follower elements for protecting said amplifying elements from overcurrent.

45. A power amplifier as in claim 44 including first and second differential amplifiers, said second differential amplifier having inputs connected to the respective outputs of said first differential amplifier and having an output connected to the input terminal means of the follower element to which the emitter means of said transistor means is connected, and a field effect transistor connected between said first differential amplifier and said constant supply source to cause a common mode rejection ratio of said first differential amplifier.

46. A power amplifier as in claim 40 wherein said second switching means is connected to the said working voltage terminal means of each of the said follower elements in said driver stage for delivering thereto the said relatively high and low working voltages respectively in correspondence with the said delivery thereof to said power amplifying elements.

* * * * *

UNITED STATES PATENT AND TRADEMARK OFFICE
CERTIFICATE OF CORRECTION

PATENT NO. : 4,087,761
DATED : May 2, 1978
INVENTOR(S) : Nubuo FUKUMOTO; Mitsugu OHIWA; Teruyoshi MATSUI & Hajime OHTA It is certified that error appears in the above-identified patent and that said Letters Patent are hereby corrected as shown below:

<u>Under the Heading</u>:

Item [30]  Foreign Application Priority Data

Please add:

December 30, 1972   Japan.....48/2945

Correct the spelling of the second inventor's first name:

-- Mitsugu OHIWA --

Signed and Sealed this

Thirteenth Day of March 1979

[SEAL]

Attest:

RUTH C. MASON
*Attesting Officer*

DONALD W. BANNER
*Commissioner of Patents and Trademarks*